(12) United States Patent
Rennie

(10) Patent No.: US 7,791,011 B2
(45) Date of Patent: Sep. 7, 2010

(54) SOLID-STATE IMAGING DEVICE AND MANUFACTURING METHOD THEREOF AND ELECTRONIC APPARATUS AND MANUFACTURING METHOD THEREOF

(75) Inventor: John Rennie, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/359,040

(22) Filed: Jan. 23, 2009

(65) Prior Publication Data

US 2009/0242736 A1 Oct. 1, 2009

(30) Foreign Application Priority Data

Mar. 26, 2008 (JP) .............................. 2008-081674

(51) Int. Cl.
*H01L 27/00* (2006.01)
*H01L 31/18* (2006.01)
*H01L 21/50* (2006.01)
(52) U.S. Cl. ....................... 250/208.1; 257/290; 438/70
(58) Field of Classification Search .............. 250/214.1, 250/214 R, 208.1; 257/290–294
See application file for complete search history.

(56) References Cited

U.S. PATENT DOCUMENTS

2006/0124832 A1* 6/2006 Harmon et al. ......... 250/214 R

FOREIGN PATENT DOCUMENTS

| JP | 01-166687 | 6/1989 |
|----|-----------|--------|
| JP | 2005-252391 | 9/2005 |
| JP | 2005-286034 | 10/2005 |
| JP | 2006-073885 | 3/2006 |
| JP | 2006-074055 | 3/2006 |
| JP | 2006-100515 | 4/2006 |
| JP | 2006-147991 | 6/2006 |
| JP | 2006-229116 | 8/2006 |
| JP | 2006-351972 | 12/2006 |
| JP | 2008-066702 | 3/2008 |
| JP | 2008-177191 | 7/2008 |
| JP | 2009-038352 | 2/2009 |

* cited by examiner

*Primary Examiner*—Seung C Sohn
(74) *Attorney, Agent, or Firm*—Robert J. Depke; Rockey, Depke & Lyons, LLC

(57) ABSTRACT

A solid-state imaging device is provided. The solid-state imaging device includes a substrate having a light sensing part for each of pixels; and one or more rod members made of a light transmissive material above the light sensing part for each of the pixels.

14 Claims, 16 Drawing Sheets

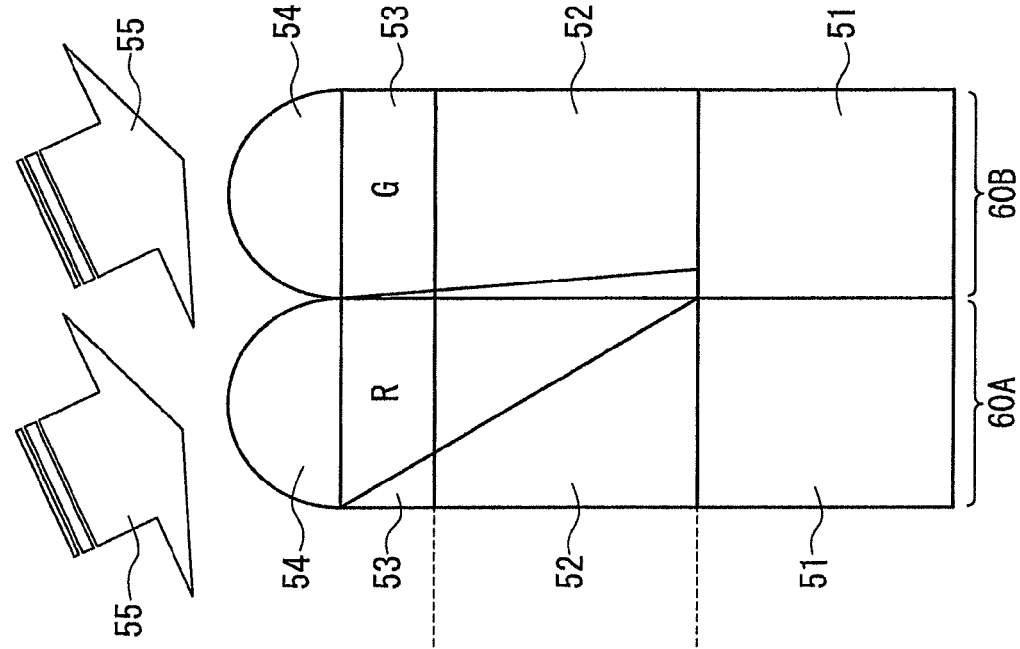
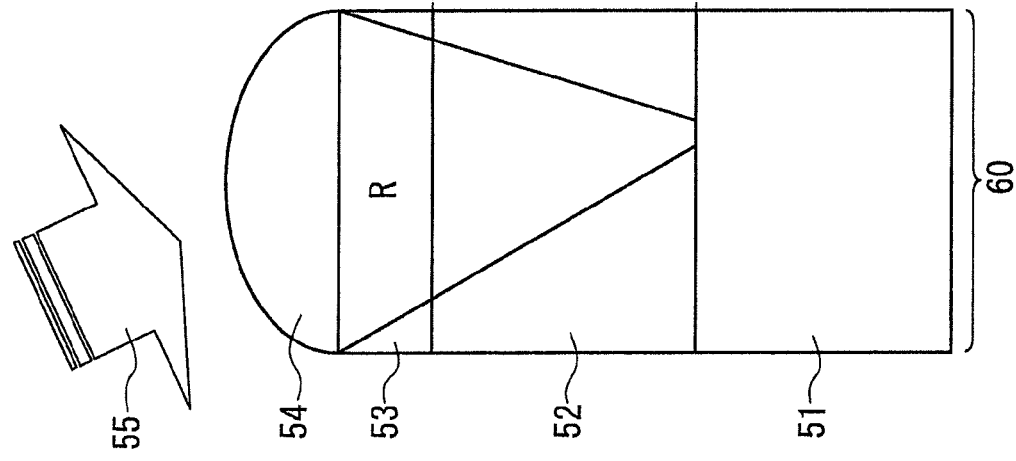

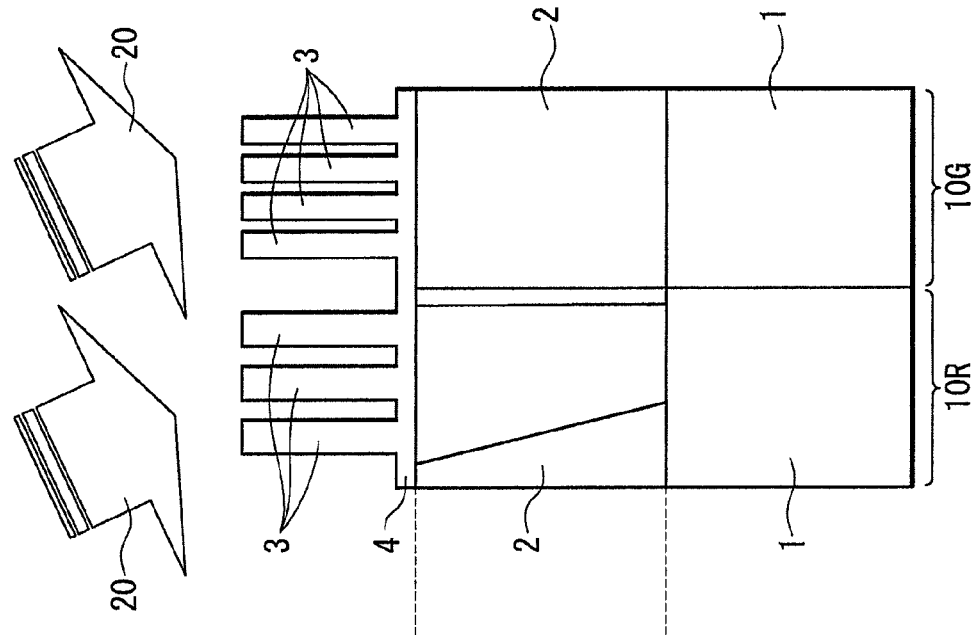
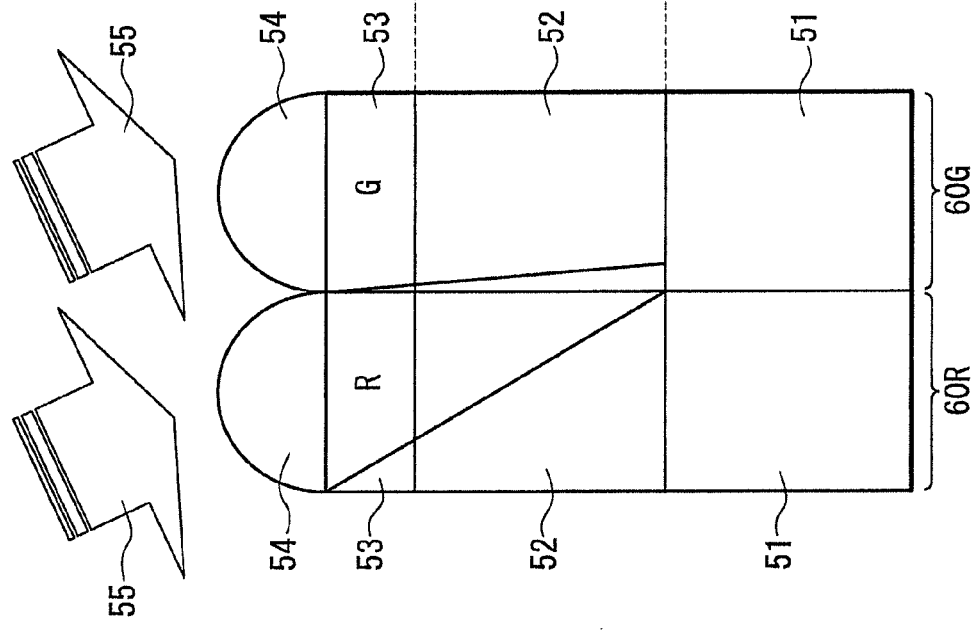

SOLID-STATE IMAGING DEVICE AND MANUFACTURING METHOD THEREOF AND ELECTRONIC APPARATUS AND MANUFACTURING METHOD THEREOF

CROSS REFERENCES TO RELATED APPLICATIONS

The present invention contains subject matter related to Japanese Patent Application JP 2008-081674 filed in the Japanese Patent Office on Mar. 26, 2008, the entire contents of which being incorporated herein by reference.

BACKGROUND OF THE INVENTION

1. Field of the Invention

The present invention relates to a solid-state imaging device and a method of manufacturing the same. The present invention also relates to an electronic apparatus using such a solid-state imaging device and a method of manufacturing the same.

2. Description of the Related Art

Image sensors are provided for devices applicable to various fields including cameras and video cameras.

The image sensor for any of such devices includes a number of pixels. The efficiency of the device as a whole depends on the dimensions of the pixel and also the configuration thereof.

A device for color images includes different types of pixels, red, green, and blue, which are typically provided with absorption color filter materials in solid state originated from organic materials.

For improving the efficiency in the pixel, a lens with a size corresponding to the pixel is typically used to keep incident light to be focused on a light-receiving element of the pixel to allow the pixel to receive the light incident thereon as much as possible, preventing the light from dispersing to surrounding pixels.

However, there may be a limit on using such a simplified lens with pixel size. The more the angle of incident light increases, the more difficult for the incident light to be retained in the pixel because of reaching to the limit. In other words, there is a limit to an angle of oblique incident light which can be corrected by the lens, and therefore if the aspect ratio of the pixel, the value obtained by dividing the width of the pixel by the height thereof, is small, the influence thereof may increase.

Therefore, since the pixel size has been reduced recently, it is more difficult for the pixel to control the influence of such color mixture using a standard on-chip lens technology. Besides, since color filters for the respective pixels may be needed, which are typically made of materials originated from organic resist, a height of the device may further increase. Thus, the existence of these color filters reduces the aspect ratio, causing color mixture to be obvious. Particularly, the smaller the pixel size is, the more the color mixture becomes obvious.

In addition, if the pixel size is reduced to 1 µm in width, the lens size may have a value close to the wavelength of light passing through the lens and gradually stops acting as a lens. In other words, the lens may stop collecting the light passing through the lens. Thus, any advantageous effect can hardly be found in the configuration of device based on the related-art lens, if the pixel size is small. Therefore, a newly devised system may be required for retaining light in pixels.

Several investigators have proposed the use of "artificial" lenses, such as a Fresnel lens, a diffraction optics lens, and a digital lens, to introduce rays of light into a pixel even when any standard lens hardly yields sufficient results (see, for example, Japanese Unexamined Patent Application Publication No. 2006-74055, and Japanese Unexamined Patent Application Publication No. 2006-351972).

Such a structure is useful in introduction of light correctly, compared with a lens typically used in the art, but having some disadvantages, such as an increase in wavelength dependency and complexity in manufacturing process.

It should be noted that a small-sized pixel may cause a still larger problem. That is, the aforementioned design requires a physical space for the action of the pixel, or requiring an extremely large width of the pixel. Thus, it is not practical to apply the aforementioned design to the small-sized pixel. The lens may be larger than the pixel. The size limit of lens depends on the wavelength of incident light, so that it can be the fundamental limit in most cases.

SUMMARY OF THE INVENTION

As briefly described above, the intention of collecting light into the pixel which becomes small more than ever has reached a stage of being insoluble by any standard on-chip lens technology. In some cases, degree of color mixture is increased to the extent of being extremely difficult in distinguishing colors and color tones.

The increase in color mixture is mainly caused by a leakage of light incident on the pixel to the surrounding pixels due to a reduction in aspect ratio. An incident angle that does not cause any problem in the design of a large pixel can be already useless in the small sized pixel.

It is noted that an incident angle may be changed in accordance with the setting value of a camera lens which is responsible for focusing light on the surface of the image sensor. It can be determined by the parameter referred to as the F value of the external focusing system. The restriction of the useful incident angle leads to restrict the type of an external lens which can be used. Besides, the system used in the aforementioned image sensor can be restricted.

When using a large pixel or a large aspect ratio, the restriction of incidence angle still exists but not so strict as compared with a small pixel.

If the device needs to distinguish colors and incorporate color filters, the physical dimensions of the aforementioned structure may need to be considered. Accordingly, the basic design of a standard process used for the production of an imaging device may need to be changed. Thus, the basic design of the sensor may be changed.

Here, the aforementioned points will be specifically described with reference to FIGS. 1A and 1B.

FIGS. 1A and 1B show cross-sections of pixels in the vertical direction. FIG. 1A illustrates a large-sized pixel in cross section and FIG. 1B illustrates small-sized pixels in cross-section, where the pixels in these figures have the same height.

In each of the figures, each pixel includes a silicon substrate 51 in which a light-receiving element, photodiode, is formed; an insulating interlayer 52 or the like; a color filter 53, and an on-chip lens 54. Furthermore, large arrows 55 represent light obliquely incident at a certain degree from the vertical direction. A conical shape in the structure represents the light passing through the on-chip lens 54 and being focused.

In the large-sized pixel in FIG. 1A, the focal point of the light 55 obliquely incident on the surface of the silicon substrate 51 is within the pixel 60 that has received the incident light.

In contrast, in the small-sized pixel in FIG. 1B, the focal point of the light incident on the surface silicon substrate 51 is out of the pixel 60A with a red (R) color filter 53 that has received the incident light and enters the adjacent pixel 60B with a green (G) color filter 53.

The size of each pixel in these figures is moderately represented. Recently, the actual size of the pixel has been changed from 5 µm to approximately 1.75 µm. Furthermore, a further reduction in size has been expected in the art.

The light passing through the on-chip lens 54 of a pixel 60A on which the light has been incident first and then entering the adjacent pixel 60B as shown in FIG. 1B may not be sharply defined. In other words, an image signal thus obtained lacks clearness.

It indicates a dilemma in pixel-size reduction. Even if the on-chip lens is fully utilized, the characteristics of the device can be hardly improved. In other words, if the incidence angle of light exceeds a certain level, the on-chip lens may not compensate the angle.

It is desirable to provide a solid-state imaging device and a method of manufacturing the same, where the solid-state imaging device is configured to prevent the generation of color mixture even if a pixel size is reduced. It is also desirable to provide an electronic apparatus with such a solid-state imaging device and a method of manufacturing the same.

According to embodiments of the present invention, there are provided a solid-state imaging device and an electronic apparatus, each including a substrate having a light sensing part for each of pixels and one or more rod members made of a light transmissive material above the light sensing part for each of the pixels.

According to embodiments of the present invention, there are provided methods of manufacturing a solid-state imaging device and an electronic apparatus, each including the steps of:

forming a light sensing part for each pixel in a substrate;

forming a layer made of a light transmissive material above the substrate; and forming one or more rod members above the light sensing part of each pixel by processing the layer made of the light transmissive material.

In the configuration of each of the solid-state imaging device and the electronic apparatus according to the embodiments of the present invention, the rod members are made of a light transmissive material. Thus, the light incident on the rod member of each pixel can efficiently be directed downward into the light sensing part formed in the substrate below the corresponding pixel.

Therefore, the light incident on the rod member can be prevented from entering the adjacent pixel to avoid the generation of color mixture.

In each of the methods of manufacturing the solid-state imaging device and the electronic apparatus according to the embodiments of the present invention, the rod member is formed above the light sensing part of each pixel by processing the layer made of the light transmissive material. Thus, the light incident on the rod member can be prevented from entering the adjacent pixel, thereby suppressing the generation of color mixture. Therefore, the solid-state imaging device and the electronic apparatus according to the embodiments of the present invention can be manufactured comparatively with ease.

According to the embodiments of the present invention, the characteristics of the solid-state imaging device can be improved while avoiding the generation of color mixture.

According to the embodiments of the present invention, it becomes possible to prevent the solid-state imaging device from generating mixture color even with small-sized pixels.

BRIEF DESCRIPTION OF THE DRAWINGS

FIGS. 1A and 1B are schematic cross-sectional views for explaining the influence of pixel size on an aspect ratio and color mixture, where FIG. 1A illustrates a large-sized pixel in cross section and FIG. 1B illustrates small-sized pixels in cross-section, in which pixels in these figures have the same height.

FIGS. 2A and 2B are schematic cross-sectional views for making a comparison between the states of color mixture in two different structures, where FIG. 2A illustrates the related-art structure with a typical on-chip lens and FIG. 2B illustrates the structure with a rod member according to an embodiment of the present invention.

Figure 3:
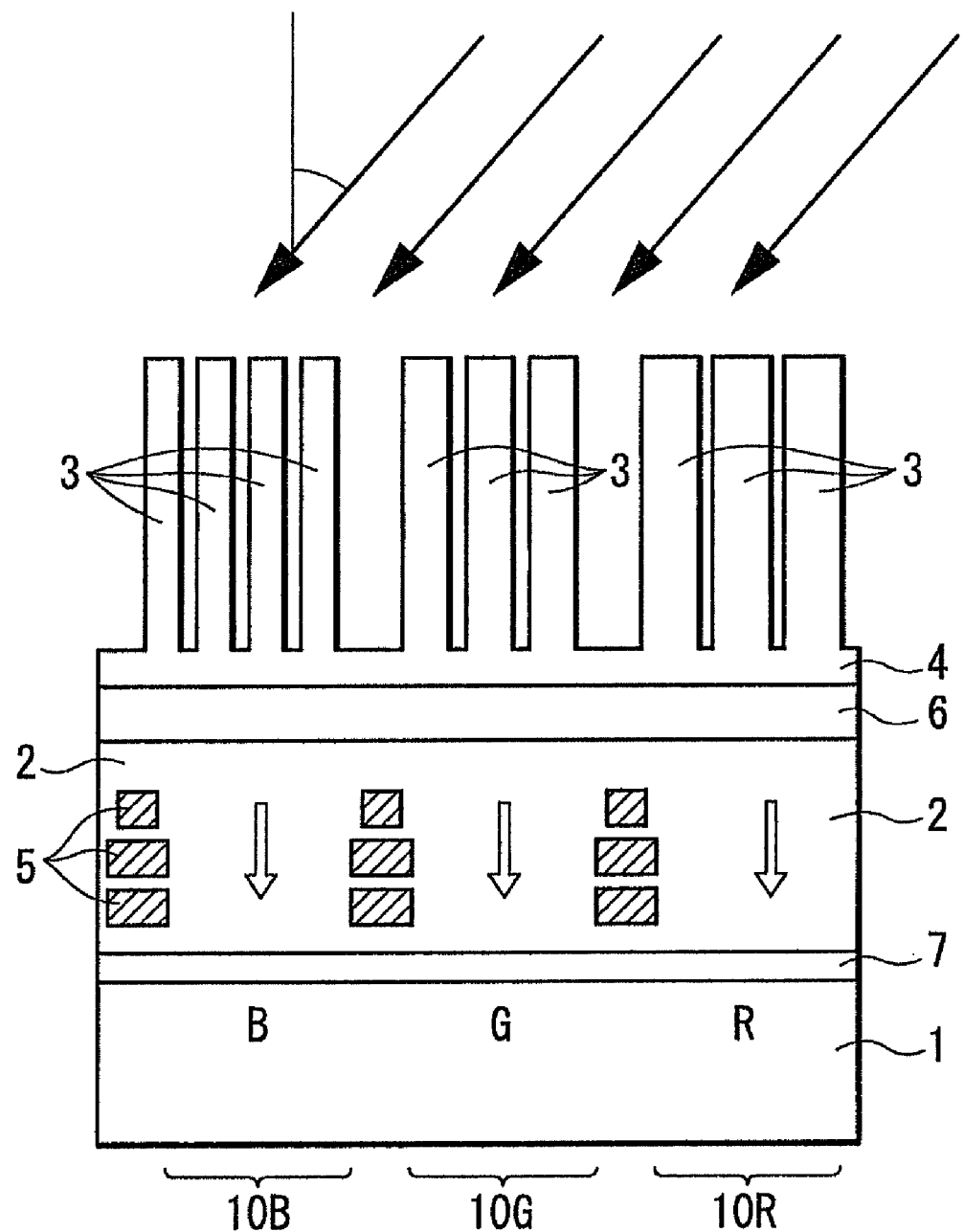
FIG. 3 is a cross-sectional view illustrating the schematic configuration of a first example of a solid-state imaging device according to an embodiment of the present invention.

DESCRIPTION OF THE PREFERRED
EMBODIMENTS

Prior to describing specific examples according to an embodiment of the present invention, the outline thereof will be described.

In the solid-state imaging device and the electronic apparatus according to embodiments of the present invention, each pixel is provided with a rod member made of a light transmissive material in place of an on-chip lens. The rod member is provided for leading incident light to a light sensing part such as a photodiode.

In a manner similar to FIGS. 1A and 1B, FIGS. 2A and 2B illustrate the structure provided with a on-chip lens according to the related-art and the structure provided with a rod member according to an embodiment of the present invention to compare the behavior of oblique incident light.

FIG. 2A illustrates the structure with the on-chip lens according to the related-art and FIG. 2B illustrates the structure with the rod member of an embodiment of the invention. These structures have the same pixel width, the same silicon substrate thickness, and the same insulating layer thickness.

In the case of the structure with the on-chip lens according to the related-art, when focusing oblique incident light 55 conically on the surface of a silicon substrate 51 through an on-chip lens 54, the light leaks from a pixel 60R with the on-chip lens 54 and enters an adjacent pixel 60G.

Thus, there may be a need of signal processing to properly subtract the degree of color mixture caused by the pixel 60R from the peak gain of the adjacent pixel 60G.

In the case of the structure with the rod member as shown in FIG. 2B, rays of oblique incident light 20 enter different rod members (hereinafter, simply referred to as rods) 3 and are then led in the longitudinal direction (i.e., in the vertical direction) of the rod 3. At this time, simultaneously, such light inclined in the oblique direction returns to the state of being not inclined because of interaction between the nearest, adjacent rods 3. Thus, most rays of the incident light can be led to the area of the silicon substrate 1 within the pixel where originally light enters.

As a result, an extremely high peak gain can be correctly obtained.

Therefore, the generation of color mixture can be suppressed in the structure shown in FIG. 2B as compared with the case of the structure with the on-chip lens according to the related-art, improving the characteristics of a solid-state imaging device using such a structure.

The structure with the rod member as shown in FIG. 2B has the upper limit of an incident angle, because rays of light may enter adjacent pixels if an incident angle further increases.

However, comparing with the structure with the on-chip lens according to the related-art, the upper limit of the incident angle in the structure with the rod member can be much higher than that of the related-art, so that a device with such a structure can be improved greatly.

FIGS. 2A and 2B two-dimensionally illustrate the phenomenon occurring in the aforementioned structures. Actually, a solid-state imaging device has a three-dimensional structure, surrounding each pixel with eight adjusting pixels.

The rod member (rod) 3 may have a circular, rectangular, or hexagonal cross section or any of other shapes in cross section.

In other words, the rod 3 is not limited to a particular shape as long as it can be formed.

In addition, the diameter or width of the rod 3 may be uniform or substantially constant in the vertical direction or may vary from the top to the bottom.

The rod member (rod) 3 can be easily formed by first forming a layer of a material (light transmissive material) for the rod 3 and then shaping it into a rod by anisotropic etching or the like.

If the rod member (rod) 3 is short, the light-guiding effect of the rod 3 may be insufficient. Thus, the rod 3 may have a height enough to ensure its light-guiding effect; a typical range of the height is not less than 300 nm. The upper limit of the height of the rod 3 depends on the etching technology and the process for forming the rod 3. An improper way of forming the rod 3 may undesirably lead to a tapered rod or the like with a certain degree or more inclination. Typically, the rod 3 has a height in the range of 0.5 μm to 6 μm.

The number of rods 3 per pixel mainly depends on the dimensions of the pixel. Most of all, the more the rods 3 are placed on the pixel, the more the advantageous effects may be obtained.

In some cases, however, a free region with a surface area of about 200 nm, a region free of the rod 3, may be left at the edge of each pixel to obtain a suitable response.

When mounting a plurality of rods 3 on one pixel, the size of the space between the adjacent rods 3 in the same pixel may be defined depending on the strength of coupling between the adjacent rods 3.

If the coupling between the adjacent rods 3 is too strong, rays of light are hardly distributed into different rods 3 but take the whole rods 3 as a single large rod 3. In this case, the rod 3 is recognized as one with a large width, so that the desired wavelength dependence may be failed.

On the other hand, if the space between the adjacent rods 3 is too large, part of the useful surface area of an image sensor is left and unused. Thus, the size of space between the adjacent rods 3 in the same pixel may be balanced and the distance between the adjacent pixels may vary typically in the range of 50 nm to 200 nm, optimally 100 nm.

Furthermore, the rod 3 has certain dimensions, or the diameter, width, and the like thereof, in the horizontal direction. Thus, the rod 3 has the characteristic features for transmitting light at wavelengths corresponding to the dimensions of the rod 3.

Therefore, the rods 3 on the same pixel in the horizontal direction have uniform dimensions, but the dimensions of the rods on different pixels are different to some extent. Accordingly, like the related-art color filters, the wavelength range of light (for example, one of R, G, or B) to be received may be defined for each pixel. Two or more different rods 3, which transmit light at different wavelength ranges, are prepared for pixels and the pixels with different kinds of the rods 3 are then arranged with regularity to allow an imaging device to obtain a color image in a manner similar to the related-art color filter.

Hereinafter, specific examples according to an embodiment of the present invention will be described with reference to the attached drawings.

FIG. 3 is a schematic cross-sectional view illustrating a first example of a solid-state imaging device according to an embodiment of the present invention.

The solid-state imaging device of the example is of a CMOS solid-state imaging device.

The solid-state imaging device includes a light sensing part that is a photodiode (not shown) formed in a silicon substrate 1 for each of pixels 10B, 10G, and 10R.

In addition, the silicon substrate 1 includes, but not shown in the figure, MOS transistors (such as a charge-transfer transistor, an amplification transistor, and a pixel-selection transistor) and peripheral circuits of the MOS transistors.

Three wiring layers 5 are formed in an insulating layer 2 above the silicon substrate 1.

These wiring layers 5 are metal wiring lines that interconnect the photodiodes and the transistors (not shown) of the pixels 10B, 10G, and 10R with the peripheral circuits and the outside of the device, respectively. Light passes through between these wiring layers 5 as indicated by the arrows in the figure, followed by entering the light sensing part (photodiode) in the silicon substrate 1.

In addition, an antireflective layer 7 is provided between the insulating layer 2 and the silicon substrate 1 to prevent the surface of the silicon substrate 1 from reflecting the light thereon.

In the figure, the insulating layer 2 is represented as a single layer. Alternatively, it may be formed of a plurality of insulating layers which are made of different materials and prepared in different manners.

Specifically, in the solid-state imaging device of this example, rod members (rods) 3 made of light transmissive materials are formed on the upper surfaces of the respective pixels 10B, 10G, and 10R.

These rods 3 extend vertically at right angle to the horizontal plane.

With the rods 3 formed on the respective pixels 10B, 10G, and 10R, as illustrated in FIG. 3, the rods 3 can guide incident light toward the light sensing part located below.

The materials of the rods 3 used may include $SiO_2$, SiN, SiON, SiC, metal oxide, polycarbonate (PC) resin, acryl resin, methacrylate methyl resin (PMMA), polyvinyl chloride (PVC), and photo resist materials.

Preferably, the material may be not only light transmissive but also easily formed into a desired shape of the rod 3.

As described above, the rod 3 can be prepared easily by forming a light transmissive material, the material of the rod 3, into a layer and then shaping the layer into a rod by anisotropic etching or the like.

There is provided an option layer 4 under the rods 3. The option layer 4 is made of the same material as that of the rods 3 and accelerates the introduction of light from the rods 3 into the silicon substrate 1.

The option layer 4 can be formed by leaving part of the lowermost portion of the layer as it is, when processing the layer into rods by anisotropic etching or the like as described above without reaching to the layer below.

In addition, an additional layer 6 for adjusting the refractive index is provided between the option layer 4 and the insulating layer 2 below.

Furthermore, in the solid-state imaging device of this example, four slim rods 3 are formed on the blue (B) pixel 10B, three slightly thick rods 3 are formed on the green (G) pixel 10G, and three thicker rods 3 are formed on the red (R) pixel 10R. In other words, the thicknesses of the rods 3 (i.e., the horizontal dimensions, such as the widths and the diameters, of the respective rods 3) and the number thereof are changed corresponding to the colors of the pixels. In contrast, three or four rods 3 on the same pixel have the same thickness.

The size of the rod 3 scales with the wavelength range of the light of color received by the light sensing part. Thick rods 3 are formed on the red (R) pixel 10R that receives the light with long wavelengths. The size of the rod 3 becomes small as the wavelength of the receiving light becomes small corresponding to the green (G) pixel 10G and the blue (B) pixel 10B.

The rods 3 are defined in three different sizes corresponding to the wavelength ranges of the light of colors received by the light sensing parts of the respective pixels 10B, 10G, and 10R. Therefore, the rods 3 have the wavelength range selectivity depending on their sizes, so that the rods 3 can be provided with the function of color filters. Furthermore, the regular-arrangement of the pixels with various kinds of rods 3 allows the image sensor to detect a color image.

Figure 4:
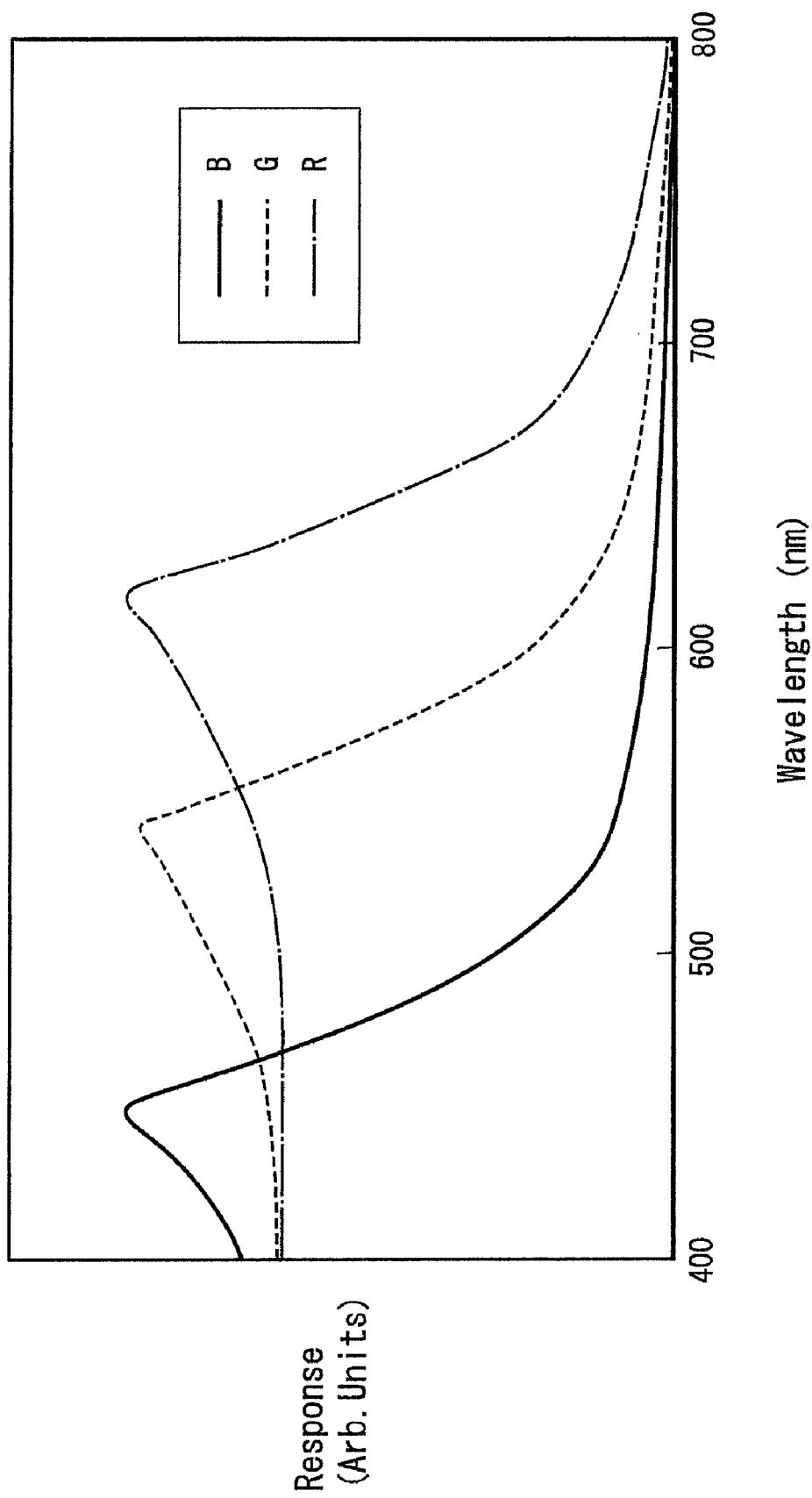
FIG. 4 is a diagram illustrating wavelength distributions (spectra) of respective rods when sizes of the rods correspond to the wavelengths of light of three different colors, B, G, and R.

FIG. 4 illustrates the distribution of wavelengths (spectra) responded by the respective rods 3 when the sizes of the rods 3 correspond to the wavelengths of three colors of light R, G, and B received by the light sensing part as illustrated in FIG. 3.

Unlike a typical color filter (bandpass filter), as shown in FIG. 4, the rod 3 can respond as a filter cutting light at long wavelengths.

This means that color signals can be generated by subtracting the responses of the respective color filters. In other words, for example, the response of the green pixel may be subtracted from the response of the red pixel to obtain an actual red signal.

An advantageous point of this structure with the rods 3 is that the response of the red pixel is the response of the white, or the response of the whole colors, improving the sensitivity of the sensor to low brightness. In addition, in contrast to a typical image sensor, noise of the blue pixel is minimum, compared with those of other color pixels. Furthermore, there is no need of providing an external infrared cut filter. However, a disadvantage of such a structure is a possibility of increasing noise caused by subtracting the respective responses. Thus, this point may need to be kept in mind.

Figure 5:
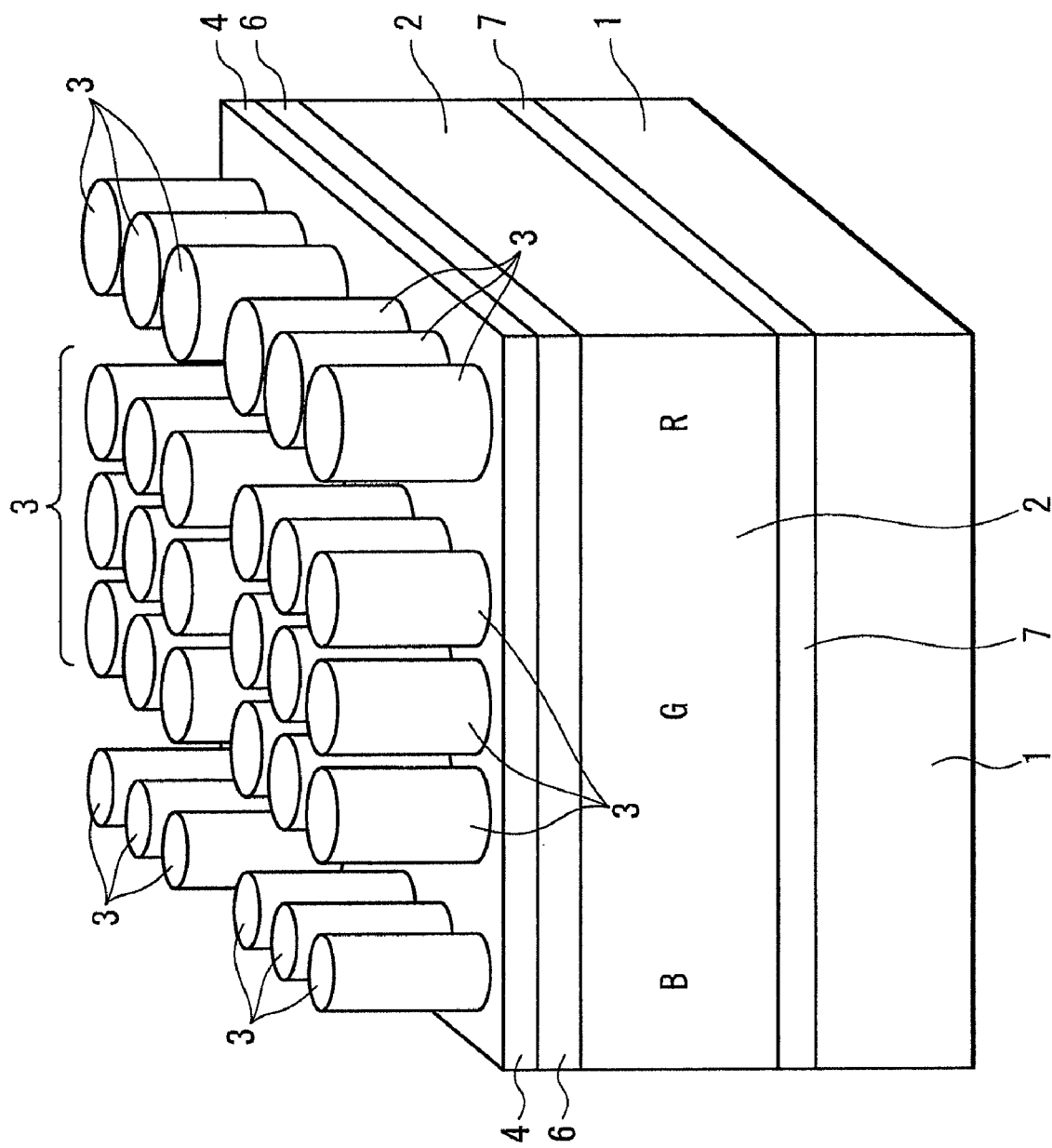
FIG. 5 is a perspective view illustrating substantial parts of the solid-state imaging device shown in FIG. 3 where each rod has a circular shape in cross section.
Figure 6:
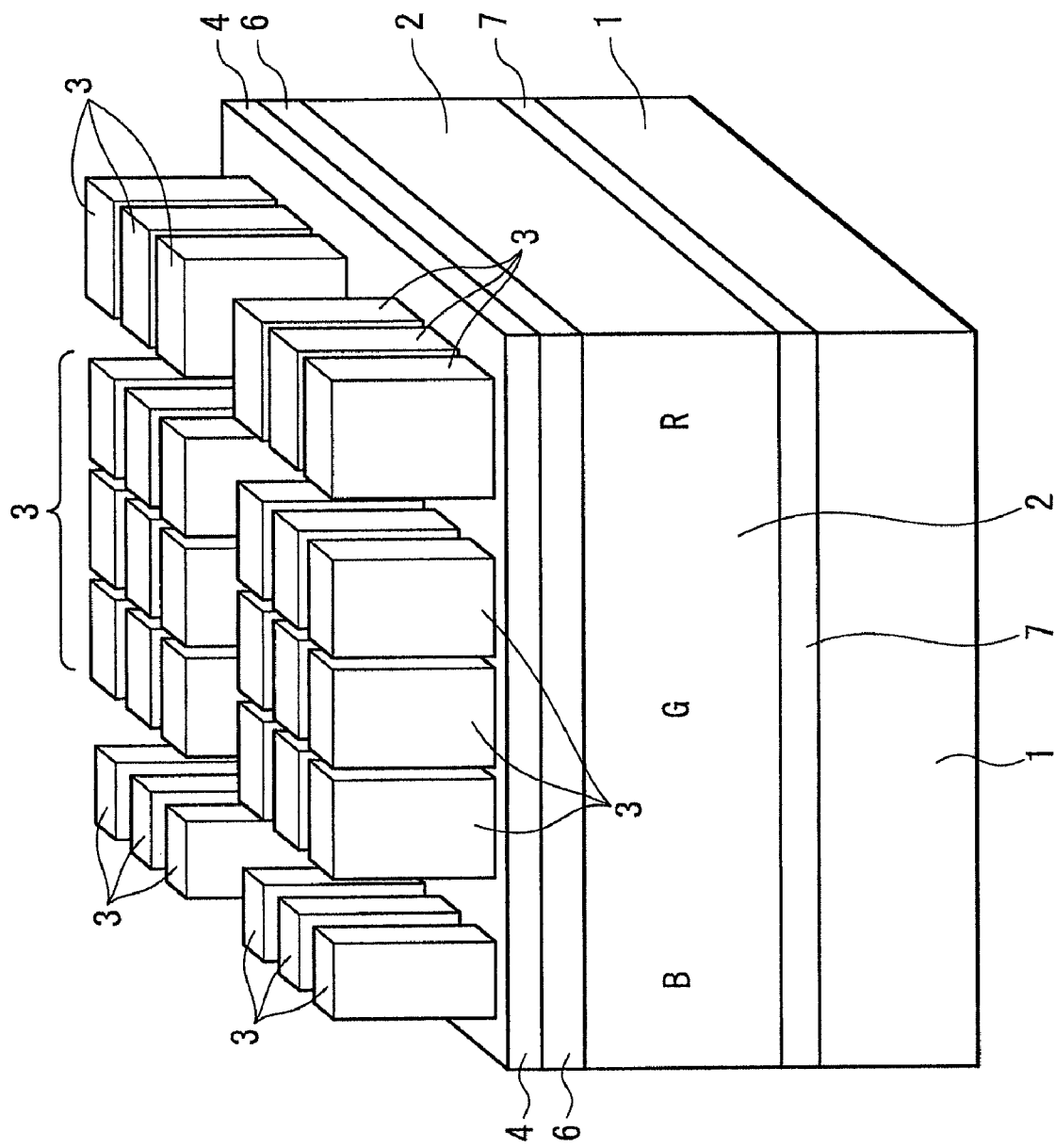
FIG. 6 is a perspective view illustrating the substantial parts of the device where each rod has a rectangular shape in cross section (rectangular rod).

FIG. 3 illustrates a cross-sectional view of the rod 3 in the axial direction thereof, and thus the cross-section of the rod 3 in the radial or width direction thereof is not represented. As described above, the cross-section of the rod 3 in the radial or width direction thereof may has any of shapes such as circular, rectangular, and hexagonal shapes. FIG. 5 illustrates a schematic perspective view of a substantial part of the device where each rod 3 has a circular shape in radial cross section. FIG. 6 illustrates a schematic perspective view of the substantial part of the device where each rod 3 has a rectangular shape in width cross section (rectangular rod).

FIG. 5 and FIG. 6 entirely illustrate a green (G) pixel while partially illustrating blue (B) and red (R) pixels when the color pixels are arranged in stripes of three colors, B, G, and R. There are two lines of pixels in each figure.

In each of FIG. 5 and FIG. 6, the green (G) pixel is provided with nine rods in total, three in each of vertical and horizontal directions per line.

Structural components other than the rods 3 in FIG. 5 and FIG. 6 are identical with those in FIG. 3.

It is preferable that the rod 3 is rectangular in cross section (square rod) as shown in FIG. 6 rather than circular as shown in FIG. 5. With the square rod having a rectangular cross section, the interaction between the rods 3 can be suitably controlled. Furthermore, the square rod can lower a loss of light caused by false reflection which occurs on the circular rod and the adjacent rod can lead the reflected light caused by false refraction in the suitable direction.

For allowing the rod 3 to suitably select a wavelength range, for example, the width or diameter of the rod 3 will be determined as described below.

The red pixel 10R may be provided with a rod 3 with a width or diameter of approximately 610 nm.

In this case, an optimal width or diameter of the rod 3 varies with both the f-stop number of the lens of a camera, which is an external device for the solid-state imaging device, and with the average incidence angle of light passed through the camera lens. For compensating the incidence angle of the light on a pixel located at the end of the image sensor, the rod 3 has a relatively small width or diameter.

Thus, the width or diameter of the rod 3 is preferably in the range of 550 nm to 620 nm.

For example, the green pixel 10G may be provide with a rod 3 with a width or diameter of approximately 560 nm.

In this case, an optimal width or diameter of the rod 3 varies with both the f-stop number of the lens of a camera, which is an external device for the solid-state imaging device, and with the average incidence angle of light passed through the camera lens. For compensating the incidence angle of the light on a pixel located at the end of the image sensor, the rod 3 has a relatively small width or diameter.

Thus, the width or diameter of the rod 3 is preferably in the range of 480 nm to 570 nm.

For example, the blue pixel 10B may be provided with a rod 3 with a width or diameter of approximately 470 nm.

In this case, an optimal width or diameter of the rod 3 varies with both the f-stop number of the lens of a camera, which is an external device for the solid-state imaging device, and with the average incidence angle of light passed through the camera lens. For compensating the incidence angle of the light on a pixel located at the end of the image sensor, the rod 3 has a relatively small width or diameter.

Thus, the width or diameter of the rod 3 is preferably in the range of 420 nm to 480 nm.

The solid-state imaging device according to the above example includes rod members (rods) 3 made of a light transmissive material on the upper surfaces of the respective pixels 10B, 10G, and 10G. The rod 3 of each pixel can direct the light incident thereon downward. Thus, the light can be led to the light sensing part formed in the silicon substrate 1 below the corresponding pixel at high efficiency.

Therefore, the light incident on the rod 3 and entering adjacent pixels can be suppressed. As a result, the generation of color mixture can be suppressed.

Furthermore, in the solid-state imaging device according to this example, each rod 3 has any of three different thicknesses defined corresponding to the wavelengths of light colors received by the light sensing parts of the respective pixels 10B, 10G, and 10R. Thus, the rods 3 have their own properties for selecting the wavelength ranges of light depending on their sizes, so that the rods 3 can be provided with the function of color filters, respectively.

Therefore, colors can be separated from one another as shown in FIG. 3 even without any layer of related-art color filters.

Furthermore, the lack of the color filter layer can shorten the distance between the rod 3 and the silicon substrate 1. Accordingly, the generation of color mixture can further be suppressed.

As described above, therefore, the solid-state imaging device of this example is configured to suppress the generation of color mixture and provided with improved characteristics.

Besides, the configuration of such as device can suppress the generation of color mixture even in small-sized pixels.

Furthermore, in FIG. 5 and FIG. 6, the color pixels are arranged in stripes of three colors, B, G, and R. Alternatively, pixels with respective colors may be placed in any of other arrangements, such as a Bayer arrangement.

Next, several other examples of a solid-state imaging device according to an embodiment of the present invention will be described.

Figure 7:
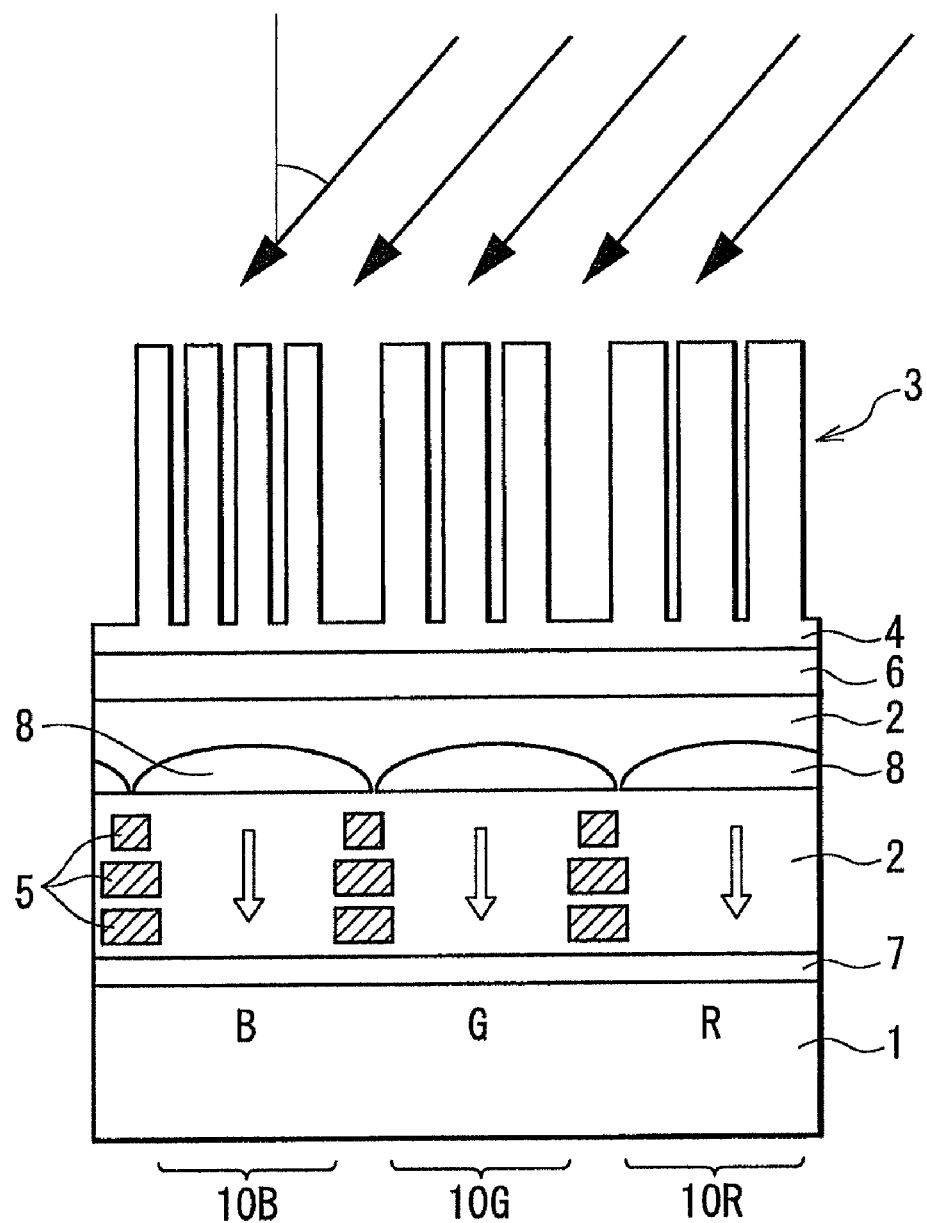
FIG. 7 is a schematic cross-sectional view illustrating a second example of a solid-state imaging device according to an embodiment of the present invention.

FIG. 7 illustrates a second example of a solid-state imaging device according to an embodiment of the present invention.

In addition to the structural components of the aforementioned device shown in FIG. 3, the solid-state imaging device of this example further includes interlayer lenses 8 above wiring layers 5 in an insulating layer 2.

The interlayer lens 8 has a convex surface on the upper side and a flat surface on the lower side. Thus, the light entered from the rod 3 on the upper side into the interlayer lens 8 is further focused to be led to the light sensing part of the silicon substrate 1.

The interlayer lens 8 is made of a material with a refractive index higher than that of the surrounding insulating layer 2.

In addition, the surrounding insulating layer 2 may be composed of two layers provided on and under the interlayer lens 8, which are made of different materials by different forming processes.

The solid-state imaging device of this example can suppress light incident on the rod 3 of a pixel from entering adjacent pixels, thereby suppressing the generation of color mixture. Furthermore, colors can be separated without the related-art color filter layer.

Furthermore, according to the solid-state imaging device of this example, the interlayer lenses 8 are provided between the rods 3 and the silicon substrate 1. Thus, the interlayer lens 8 focuses the light from the rod 3, increasing the amount of light incident on the light sensing part.

Furthermore, as shown in FIG. 7, the interlayer lens 8 has the convex surface on the upper side and the flat surface on the lower side. Alternatively, the top and bottom surfaces of the interlayer lens 8 may have any of other shapes as long as it has the function of a lens that focuses the incident light. For example, it may have a flat surface on the upper side and a convex surface on the lower side or convex surfaces on both sides.

Figure 8:
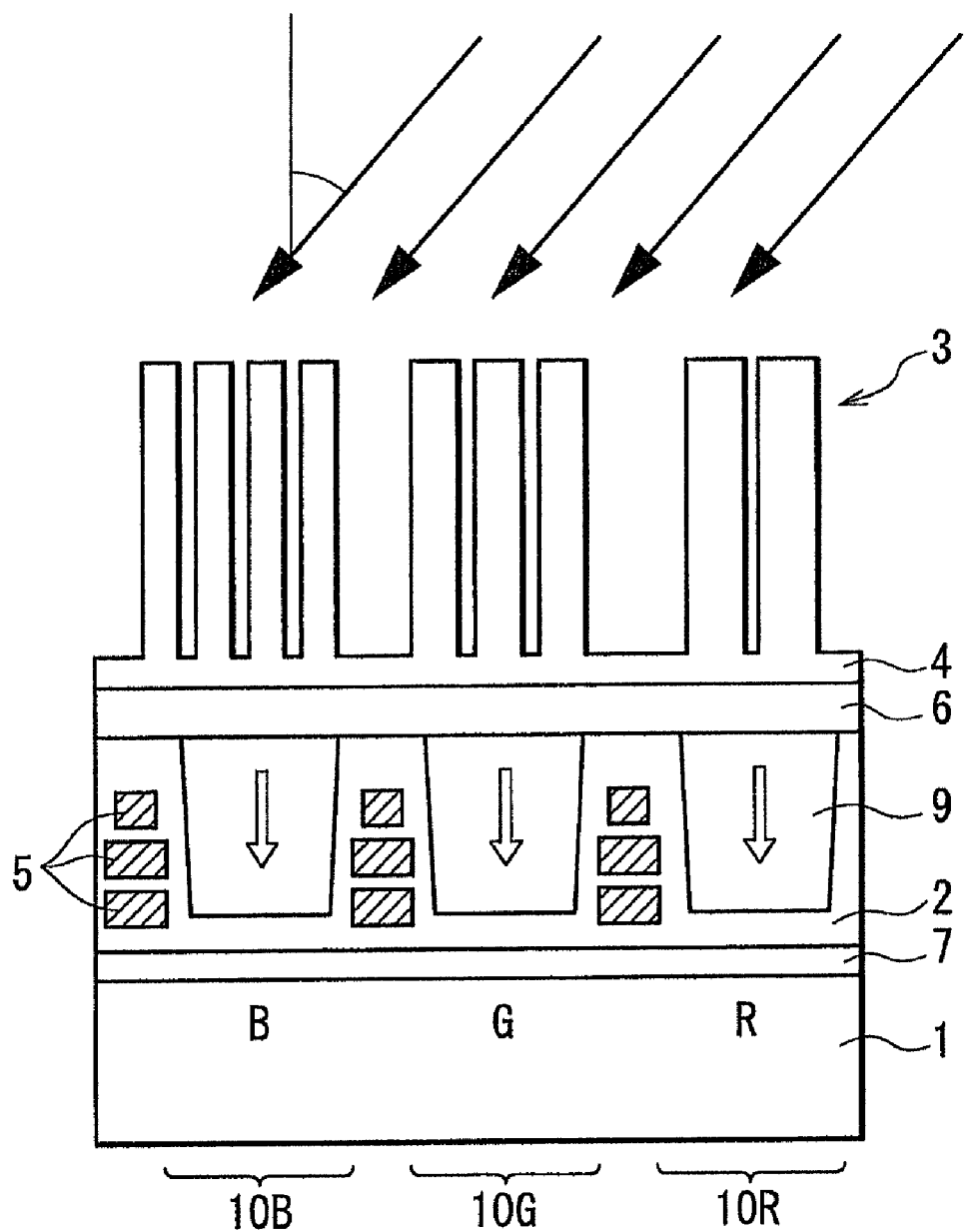
FIG. 8 is a schematic cross-sectional view illustrating a third example of a solid-state imaging device according to an embodiment of the present invention.

FIG. 8 is a schematic cross-sectional view of a third example of a solid-state imaging device according to an embodiment of the present invention.

In this example, in addition to the structural components of the aforementioned example shown in FIG. 3, an optical waveguide 9 is provided in the space between the wiring layers 5 in the vertical direction in the insulating layer 2.

The optical waveguide 9 is formed by making a groove in an insulating layer 2 and then filing the groove with a material of the optical waveguide 9.

The material of the optical waveguide 9 is preferably one with a refractive index considerably different from that of the surrounding insulating layer 2. The more the difference between the refractive indexes of the optical waveguide 9 and the surrounding insulating layer 2, the more the advantageous effects of the optical waveguide 9 increase.

The solid-state imaging device of this example can suppress the light incident on the rod 3 of a pixel and entering the adjacent pixel, thereby suppressing the generation of color mixture as in the case with the solid-state imaging device of any of the first and second examples. In addition, colors can be separated without the related-art color filter layer.

Furthermore, in the solid-state imaging device of the this example, the optical waveguides 9 are provided between the rods 3 and the silicon substrate 1, so that the optical waveguide 9 can lead the light to the light sensing part of the corresponding pixel to increase the amount of light incident thereon.

In other words, this example exerts almost the same effects as those of the interlayer lens 8 of the second example shown in FIG. 7. In addition, in contrast to the interlayer lens 8 provided above the wiring layer 5 in FIG. 7, the optical waveguide 9 is formed in the space between the wiring layers 5. Thus, the height of the entire device can be lower than one with the interlayer lenses 8. The smaller height of the entire device also contributes to suppress the undesired color mixture.

In addition, the limiting size of the pixel allowing the formation of the optical waveguide 9 is smaller than one allowing the formation of the interlayer lens 8. Thus, the configuration of the device of this example can be applied to a pixel size smaller than that of the second example.

Figure 9:
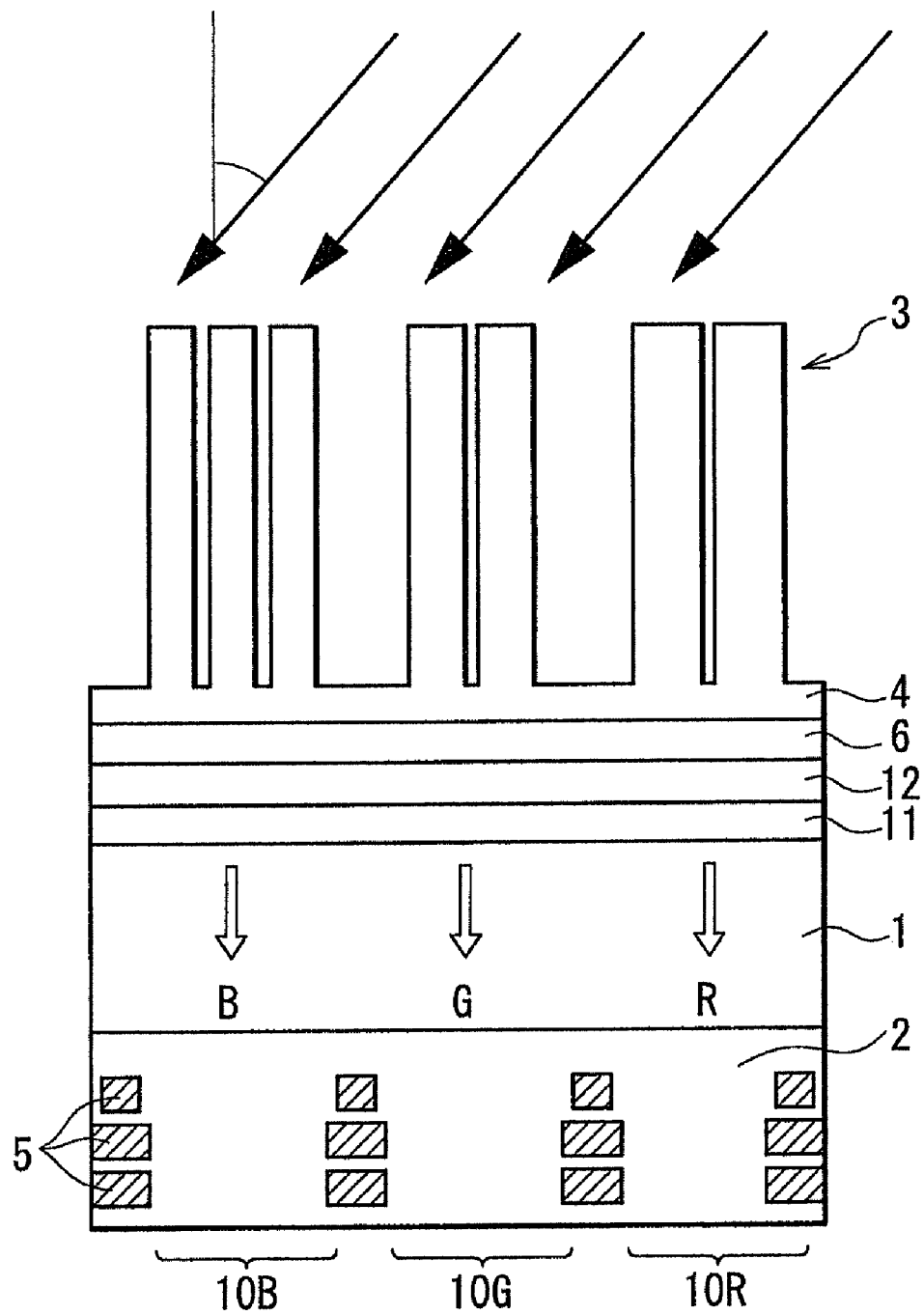
FIG. 9 is a schematic cross-sectional view illustrating a fourth example of a solid-state imaging device according to an embodiment of the present invention.

FIG. 9 is a schematic cross-sectional view of a fourth example of a solid-state imaging device according to an embodiment of the present invention.

Any of the aforementioned examples has the wiring layers 5 formed above the silicon substrate 1. In other words, any the above solid-state imaging devices is designed as a front-illuminated type that allows light to be incident on the light sensing part from a side where the wiring layers 5 are provided.

In contrast, in this example, wiring layers 5 are formed below a silicon substrate 1. Thus, the solid-state imaging device is designed as a back-illuminated type that allows light to be incident on the light sensing part from the side opposite to the side where the wiring layers 5 are provided.

In this example, the wiring layers 5 and the surrounding insulating layer 2 are located below the silicon substrate 1. In addition, there is an option layer 4 under the rods 3. Furthermore, a layer 6 for adjusting the refractive index of the stacked layers to be appropriate is provided under the option layer 4. Furthermore, a passivation layer 12 is formed between the layer 6 and the silicon substrate 1. Here, an additional layer 11 for adjusting the refractive index of the stacked layers is provided between the passivation layer 12 and the silicon substrate 1. Thus, the device includes the refractive-index-adjusting layers 6 and 11 above and below the passivation layer 12.

Other structural components of the device of this example are similar to those of the examples shown in FIGS. 3, 5 and 6, so that redundant descriptions thereof will be omitted.

The solid-state imaging device of this example can suppress the light incident on the rod 3 of a pixel and entering the adjacent pixel, thereby suppressing the generation of color mixture as in the case with the solid-state imaging device of any of the above-described examples. In addition, colors can be separated without the related-art color filter layer.

In the solid-state imaging device of this example, furthermore, the distance between the silicon substrate 1 and the rods 3 is shorter than that of any of the aforementioned examples, because the wiring layers 5 are formed on the side opposite to the light-entering rods 3. Thus, a further reduction in color mixture can be attained.

Furthermore, the solid-state imaging device of this example can further increase the utilization efficiency of light as the light output from the rods 3 is almost directly led to the surface of the silicon substrate 1.

Furthermore, the structure from the rods 3 to the silicon substrate 1 can be simplified, so that the pixel sizes can be substantially unlimited. Therefore, this example can be applied to a pixel of an extremely small size.

Figure 10:
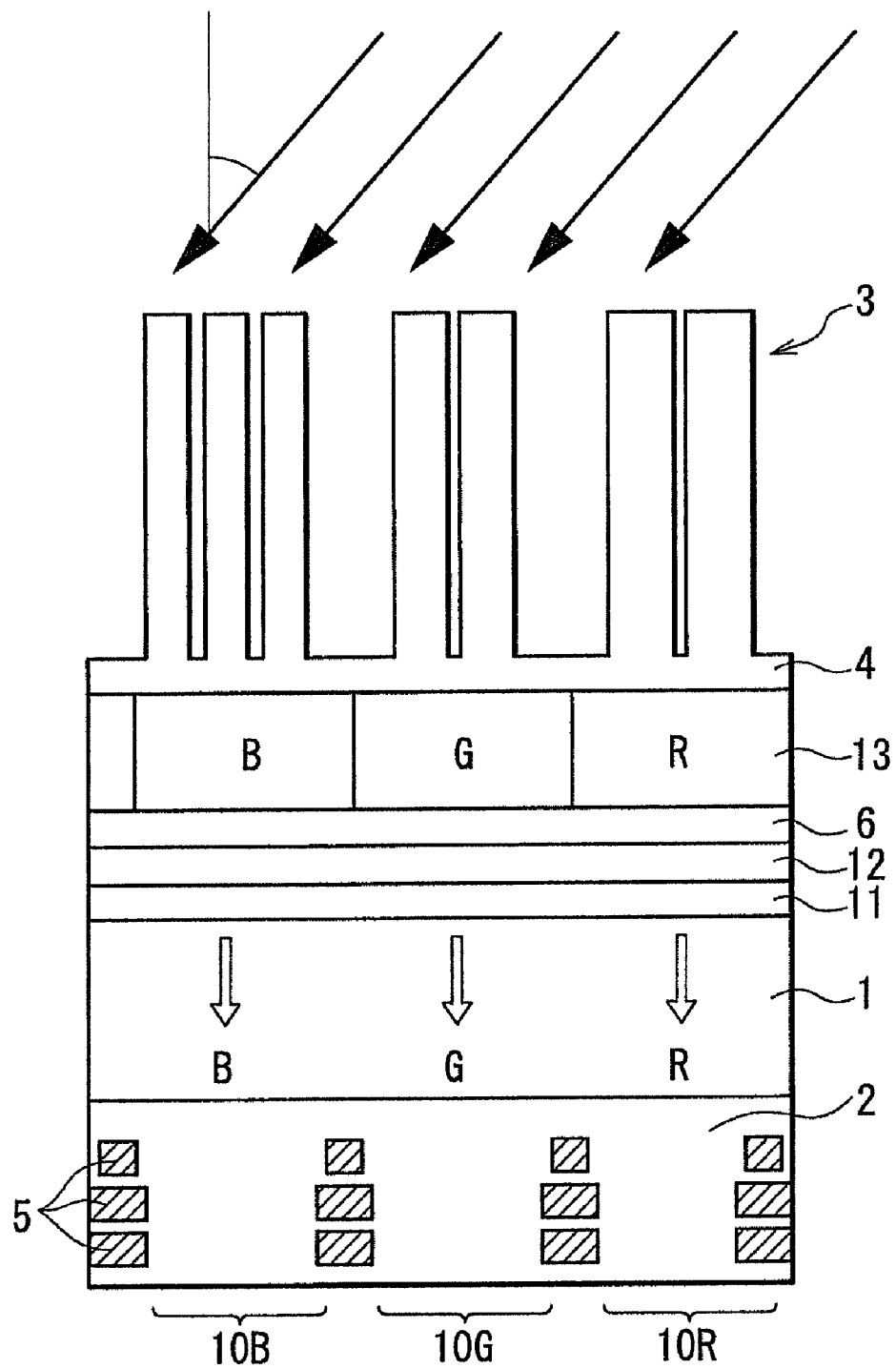
FIG. 10 is a schematic cross-sectional view illustrating a fifth example of a solid-state imaging device according to an embodiment of the present invention.

FIG. 10 is a schematic cross-sectional view of a fifth example of a solid-state imaging device according to an embodiment of the present invention.

A solid-state imaging device of this example is provided with the related-art color filter in addition to the structural components of the device of the fourth example shown in FIG. 9.

Specifically, color filters 13 of three different colors, B, G, and R, are formed between the option layer 4 and the refractive-index-adjusting layer 6.

Other structural components of the device of this example are similar to those of the fourth example shown in FIG. 9, so that redundant descriptions thereof will be omitted.

Like the solid-state imaging device of any of the aforementioned examples, the solid-state imaging device of this example can suppress the light incident on a rod 3 and entering the adjacent pixel, thereby suppressing the generation of color mixture.

Furthermore, since the solid-state imaging device of this example is provided with the color filters 13 of three colors, B, G, and R in addition to the configuration of the fourth example as shown in FIG. 9, the respective color filters 13 can separate all or part of colors.

Therefore, the colors can be separated more definitely with a combination of the rods 3 and the color filters 13.

The configuration of this example has an additional height between the rods 3 and the silicon substrate 1 as high as the thickness of the color filters 13. Thus, it may be difficult for this example to be applied to extremely-small-sized pixels to which the configuration of the fourth example as shown in FIG. 9 can be applied.

In addition, whether the rods 3 are used in combination with the color filters 13 depends on the extent of need for color separation in possible uses.

Furthermore, the combination of the rods 3 and the color filters 13 may also be applied to any of the devices of the respective examples as shown in FIGS. 3, 7, and 8.

Figure 11:
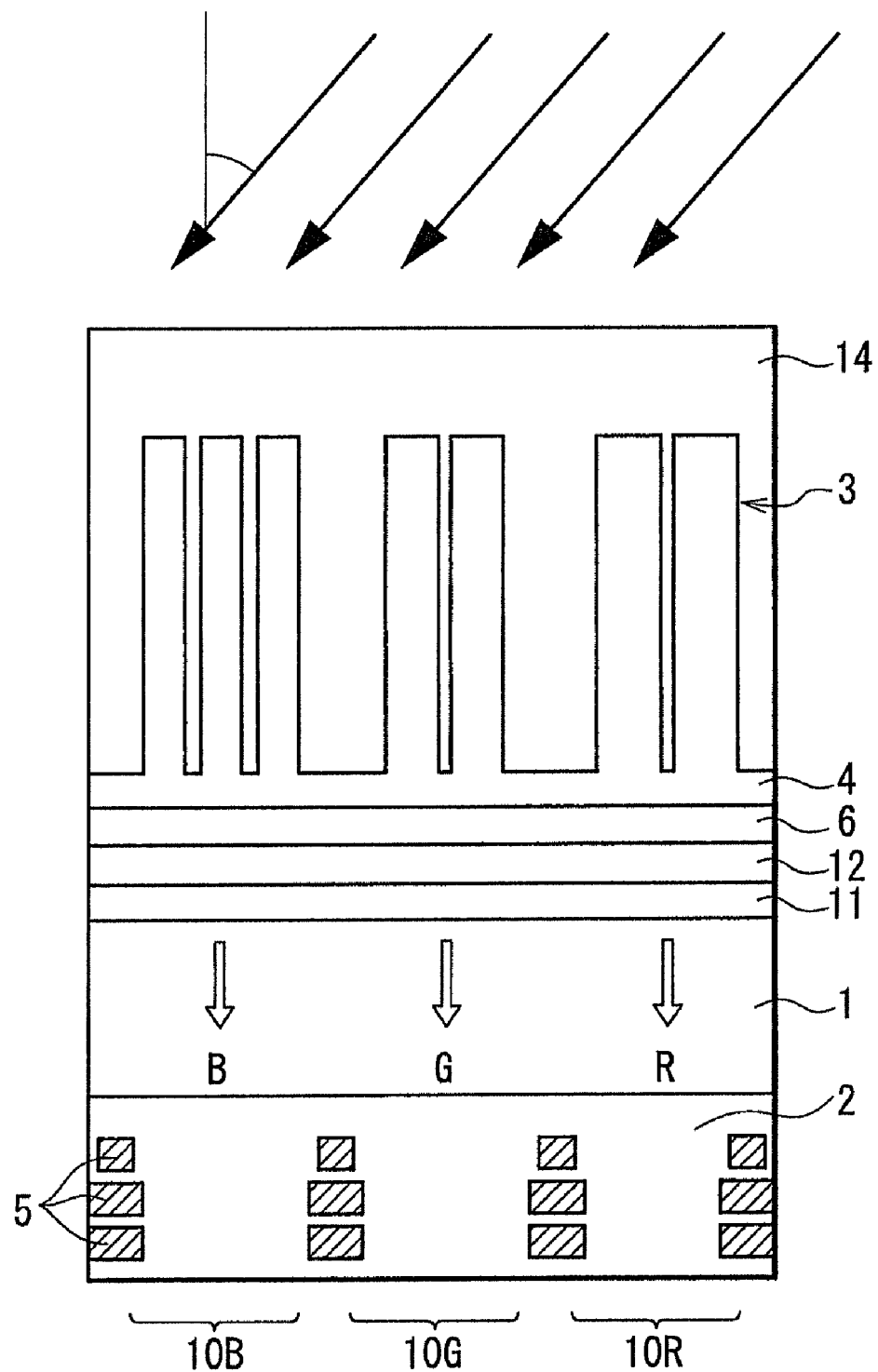
FIG. 11 is a schematic cross-sectional view illustrating a sixth example of a solid-state imaging device according to an embodiment of the present invention.

FIG. 11 is a schematic cross-sectional view of a sixth example of a solid-state imaging device according to an embodiment of the present invention.

In this example, in addition to the configuration of the device of the fourth example as shown in FIG. 9, the surrounding area of the rod 3 is embedded with a material (filler) 14 which is different from the material of the rod 3.

The material 14, which can be embedded in the surrounding area of the rod 3, may be such a material as a polymer appropriately transmissive to visible light.

Other structural components of the device of this example are similar to those of the fourth example as shown in FIG. 9, so that redundant descriptions thereof will be omitted.

The solid-state imaging device of this example can suppress the light incident on the rod 3 of a pixel and entering the adjacent pixel, thereby suppressing the generation of color mixture as in the case with the solid-state imaging device of any of the above-described examples. In addition, colors can be separated without the related-art color filter layer.

Furthermore, in the solid-state imaging device of this example, the surrounding area of the rod 3 is embedded with the different material 14 to physically fix the rod 3. Thus, the slim rod 3 can be protected from being damaged in use and retained as it is.

Furthermore, the configuration of the device with the surrounding area of the rod 3 embedded with the different material 14 may be applied to any of the examples as shown in FIGS. 3, 7, 8, 9, and 10.

Figure 12:
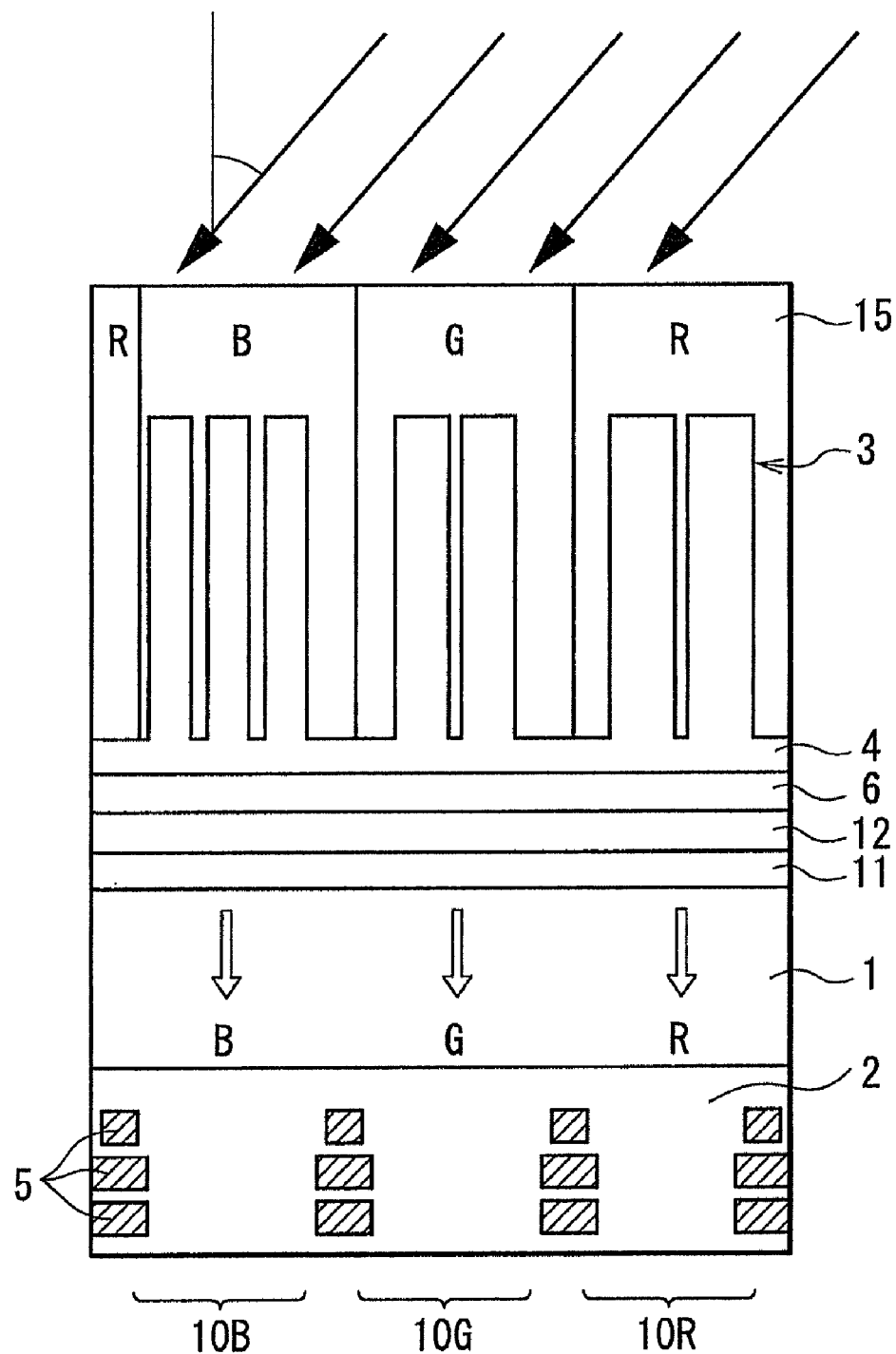
FIG. 12 is a schematic cross-sectional view illustrating a seventh example of a solid-state imaging device according to an embodiment of the present invention.

FIG. 12 illustrates a schematic cross-sectional view of a seventh example of a solid-state imaging device according to an embodiment of the present invention.

In this example, in addition to the structural components of the device of the fourth example shown in FIG. 9, the surrounding area of each rod 3 is embedded with a color filter material 15 of any of three colors, B, G, and R corresponding to the respective pixels.

Other structural components of the device of this example are similar to those of the fourth example shown in FIG. 9, so that redundant descriptions thereof will be omitted.

The solid-state imaging device of this example can suppress the light incident on the rod 3 of a pixel and entering the adjacent pixel, thereby suppressing the generation of color mixture as in the case with the solid-state imaging device of any of the above-described examples.

Furthermore, in the solid-state imaging device of this example, the surrounding area of the rod 3 is embedded with the different material 15 to physically fix the rod 3. Thus, the slim rod 3 can be protected from being damaged in use and retained as it is.

Furthermore, since the solid-state imaging device of this example is provided with color filter materials 15 of three colors, B, G, and R, the respective color filters 13 can separate all or part of colors. Therefore, the colors can be separated more definitely with a combination of the rods 3 and the color-filter material 15.

According to this example, the color-filter material 15 (filler) embedded in the surrounding area of the rod 3 has advantageous effects. It can provide the device with an improved ability of separating colors without increasing the height from the upper side of the respective rods 3 to the silicon substrate 1 on which the corresponding light sensing parts are formed.

Furthermore, the configuration of the device with the surrounding area of the rod 3 embedded with the color-filter material 15 may also be applied to those of the respective examples as shown in FIGS. 3, 7, 8, and 9.

In an embodiment of the present invention, the other structural components than the rods may be determined depending on the applicability and size of the pixels.

Furthermore, a solid-state imaging device without the need for extracting color information, such as a solid-state imaging device for obtaining a monochrome image or for mainly receiving and detecting infrared light, includes common rods 3 distributed over the entire sensor. In other words, equal-sized rods 3 are formed.

For example, the solid-state imaging device for obtaining a monochrome image is provided with rods 3 with a width or diameter of approximately 610 nm on the respective pixels.

In this case, however, an optimal width or diameter of the rod 3 varies with both the f-stop number of the lens of a camera, which is an external device for the solid-state imaging device, and with the average incidence angle of light passed through the camera lens. For compensating the incidence angle of the light on the pixel located at the end of the image sensor, the rod 3 has a relatively small width or diameter.

Therefore, the width or diameter of the rod 3 is optimally in the range of 590 to 640 nm.

Furthermore, examples obtained by modifying the configurations of the devices according to the respective examples as described above will be described below.

Figure 13:
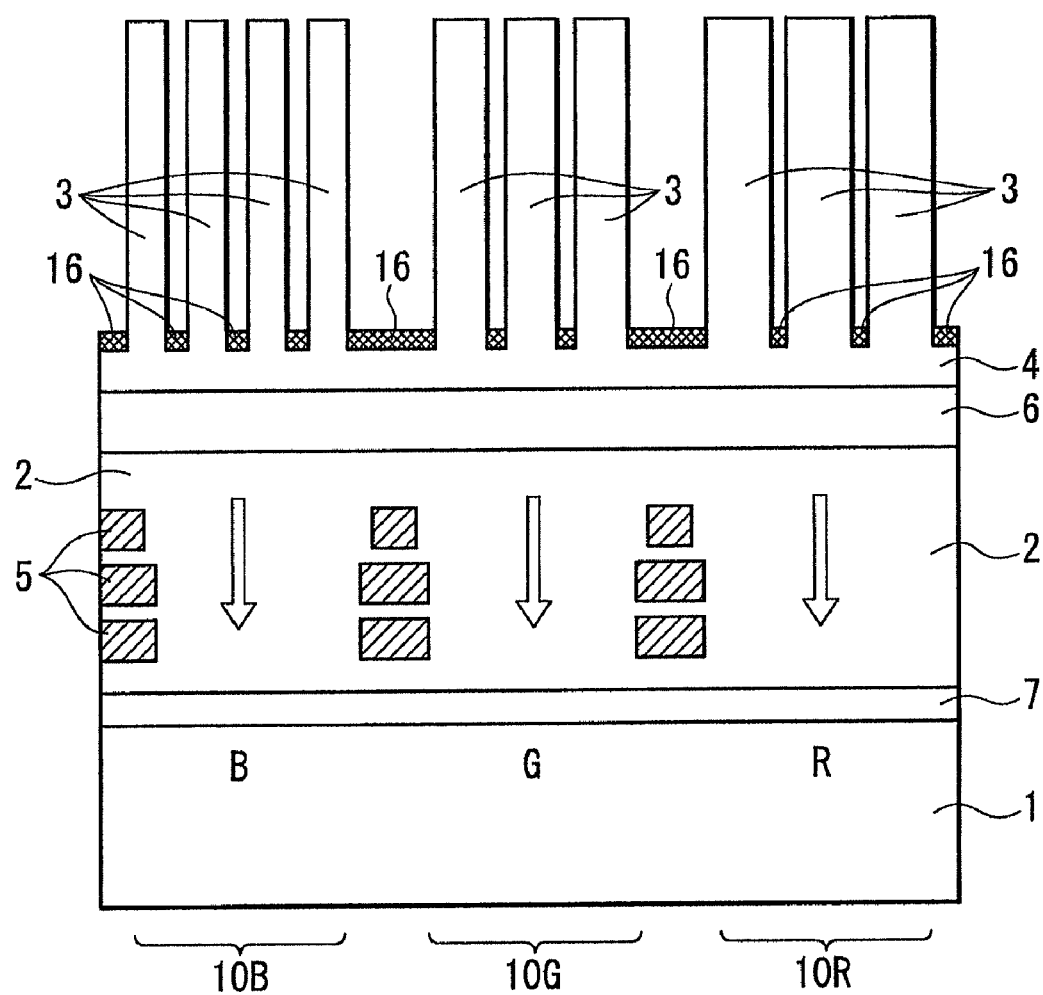
FIG. 13 is an enlarged schematic cross-sectional view illustrating an eighth example of a solid-state imaging device according to an embodiment of the present invention.

FIG. 13 illustrates a schematic configuration (enlarged cross-sectional view) of an eighth example of a solid-state imaging device according to an embodiment of the present invention.

In this example, the device of the first example as shown in FIG. 3 is provided with a reflective layer 16 with high reflectivity. The reflective layer 16 is formed on an option layer 4, extending over the space between the rods 3 (rod-free portion).

The material of the reflective layer 16 may be a metal such as Al, Au, or W, a high refractive-index material such as SiN, SiC, and $TiO_2$, or any of other similar oxides.

In addition, the reflective layer 16 used may be a layer with the highest refractive index in a stacked film including layers formed of a plurality of films with different refractive indexes.

Thus, with the reflective layer 16, it seems that the surface area used by a sensor is lost. However, in most cases, the light first reflected by the reflective layer 16 is taken by the adjacent pixel 3 and then directed to the light sensing part of the silicon substrate 1. Thus, the utilization efficiency of light can be improved.

Other structural components of the device of this example are similar to those of the first example shown in FIG. 3, so that redundant descriptions thereof will be omitted.

The solid-state imaging device of this example can suppress the light incident on the rod 3 of a pixel and entering the adjacent pixel, thereby suppressing the generation of color mixture as in the case with the solid-state imaging device of any of the above-described examples. In addition, colors can be separated without the related-art color filter layer.

Furthermore, since the solid-state imaging device of this example is provided with the reflective layer 16 extending over the space between the rods 3 in addition to the configuration of the device of the first example as shown in FIG. 3, the light incident on the reflective layer 16 can be reflected and then again taken by the adjacent rod 3. As a result, the utilization efficiency of light can be improved.

Furthermore, the configuration of the device with the reflective layer 16 extending over the space between the rods 3 may also be applied to that of each of the second to seventh examples. If the space between the rods 3 is embedded with the filler 14 or 15 as in the case of the sixth or seventh example, the reflective layer 16 is provided between the filler 14 or 15 and the option layer 4.

Figure 14:
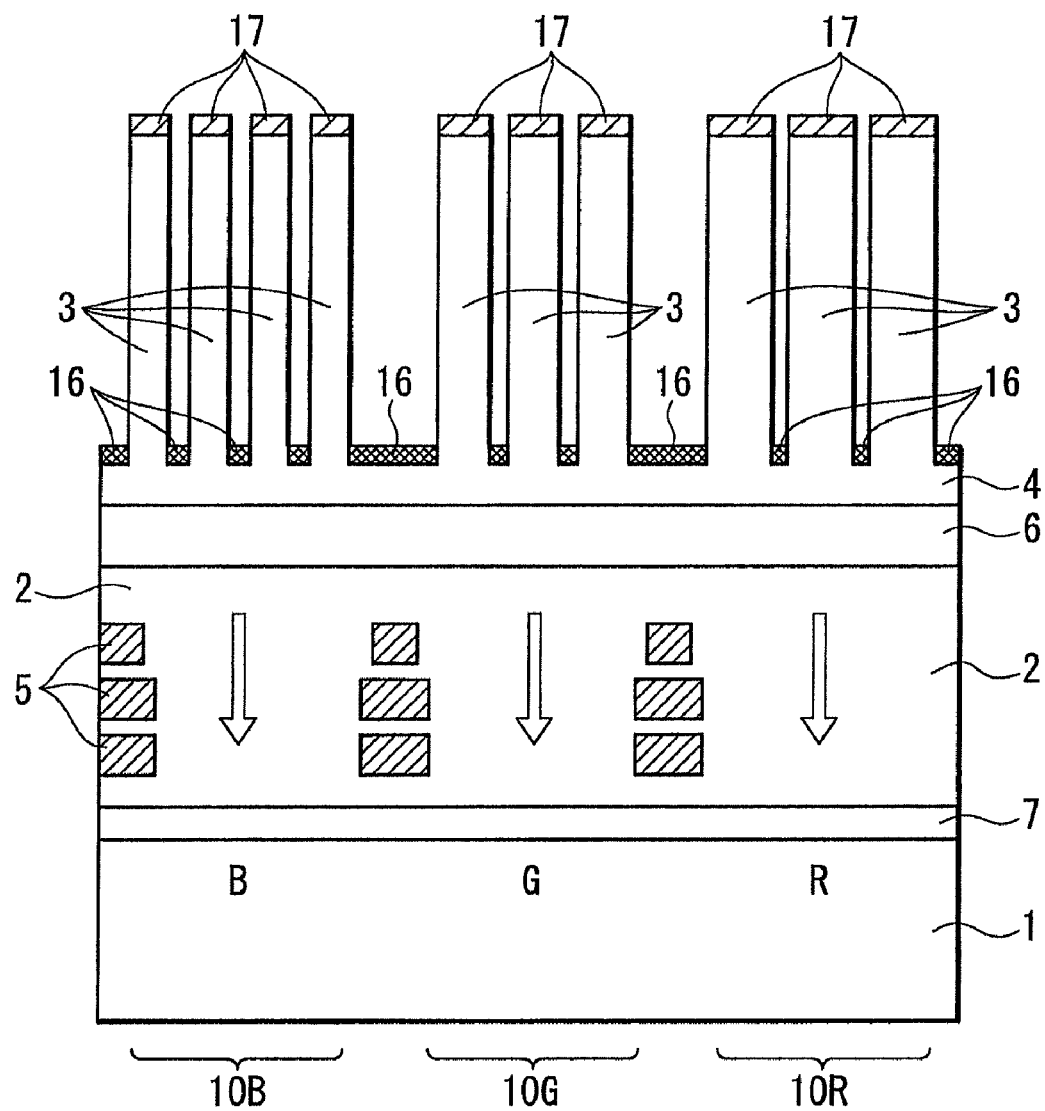
FIG. 14 is an enlarged schematic cross-sectional view illustrating a ninth example of a solid-state imaging device according to an embodiment of the present invention.

FIG. 14 illustrates a schematic configuration (enlarged cross-sectional view) of a ninth example of a solid-state imaging device according to an embodiment of the present invention.

In this example, the device of the eighth example as shown in FIG. 13 is provided with a refractive-index-adjusting layer 17 on the upper end of each rod 3. The refractive-index-adjusting layer 17 is made of a material with a refractive index which is an intermediate between the refractive index of the material of the rod 3 and that of the surrounding material thereof (e.g., air).

In this example, the refractive index-adjusting layer 17 is only formed on the upper end of the rod 3.

Typical materials for the refractive index-adjusting layer 17 include SiON, $SiO_2$, CaF, MgF, and LiF. The upper end of the rod 3 may be coated with any of these materials to form the refractive index-adjusting layer 17.

For further increasing the amount of light incident on the rod 3, the refractive index-adjusting layer 17 may be formed on the lateral side of the rod 3 in a manner similar to the upper end thereof. In this case, however, the coupling of light with the rod 3 may be reduced.

The solid-state imaging device of this example can suppress the light incident on the rod 3 of a pixel and entering the adjacent pixel, thereby suppressing the generation of color mixture as in the case with the solid-state imaging device of any of the above-described examples.

Furthermore, as described above, in addition to the configuration of the device of the eighth example as shown in FIG. 13, the solid-state imaging device of this example is provided with the refractive index-adjusting layer 17 made of a material with a refractive index which is an intermediate between the refractive index of the material of the rod 3 and that of the surrounding material thereof (e.g., air). Thus, the device suppresses the reflection of light incident on the refractive index-adjusting layer 17 and allows a more amount of light to be incident on the rod 3. Therefore, the utilization efficiency of the light can further be improved.

Furthermore, the configuration of the device of this example in which the refractive index-adjusting layer 17 is formed on the upper end and/or the lateral side of the rod 3 can be applied to that of any of the second to seventh examples having no reflective layer 16. In addition, the configuration of the device according to any of the second to seventh examples may be combined with the configuration of the device with both the reflective layer 16 and the refractive index-adjusting layer 17 of the ninth example. In addition, in the case where the space between the rods are embedded with a filler (such as the embedding material 14 or the color-filter material 15) as illustrated in the sixth and seventh examples, the refractive index-adjusting layer 17 may be designed to have a refractive index which is an intermediate between the refractive index of the rod 3 and that of the surrounding material thereof.

According to an embodiment of the present invention, properties of an image sensor in small pixels of less than 2 µm in size are improved and retained. Obviously, an embodiment is also useful in an image sensor with relatively large pixels, because the rod members (rods) can lead the incident light to the light sensing parts efficiently.

The main improvement obtained by an embodiment is a reduction in color mixture among the pixels.

In addition, another improvement which can be attained by the embodiment is an improvement in shading characteristic along the diagonal line of the image sensor.

Figure 15:
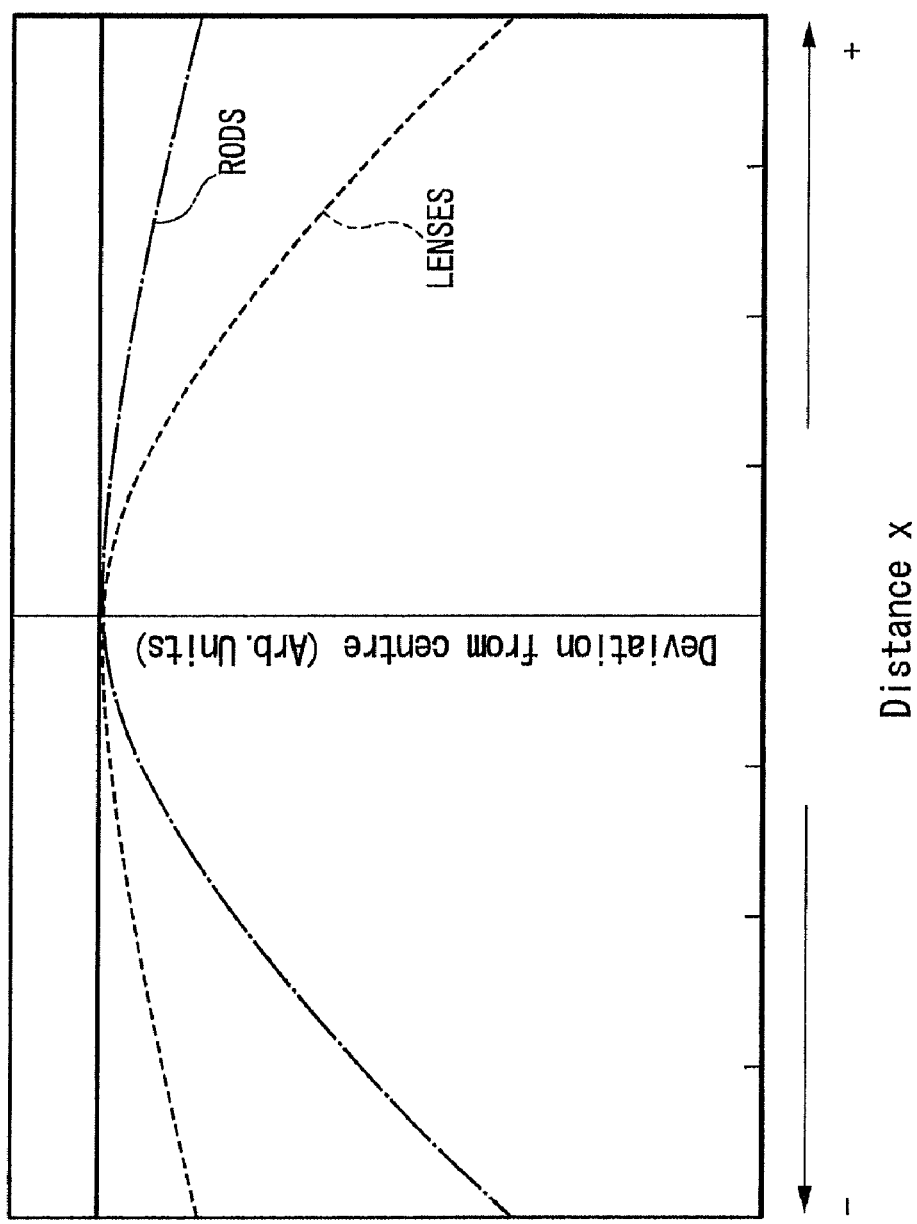
FIG. 15 is a diagram representing the results of determining the amount of shading in each of different structures of typical image sensors with the same pixel size.

Two average image sensors with same pixel size were prepared, except of one having related-art typical on-chip lenses and the other having the aforementioned rods of the embodiment. Then, the amount of shading in each of these image sensors, specifically the amount of deviation of the light-incidence position in a photodiode from the center thereof, was determined. The determined results are represented in FIG. 15. In the figure, the horizontal axis represents the distance "x" as a determined position and the vertical axis represents the amount of shading.

Ideally, a fixed response is obtained over the whole chip of an image sensor.

However, the more the position of the pixel is located near the end of the chip, the more the degree of incidence angle becomes sharp to cause an increase in displacement of the light-incidence position from the center of the pixel. As a result, the peak gain of the pixel decreases.

On the other hand, if the pixel design and/or the F value of the external lens are/is unsuitable, then a degree of decrease in the peak gain becomes large. Thus, any typical method may not carry out correction and the chip of the image sensor may not work.

As shown in FIG. 15, in the case of a structure with on-chip lens ("LENSES" in the figure), the more the absolute value of distance "x" on the chip increases on the "+" side or the "−" side, the more the deviation from the center occurs. It indicates that a reduction in pixel size leads to a difficulty in compensation in optical design with the standard lens structure.

In contrast, as shown in FIG. 15, even with the same pixel size, a large improvement can be attained using a simplified structure with rods 3 ("RODS" in the figure).

Figure 16:
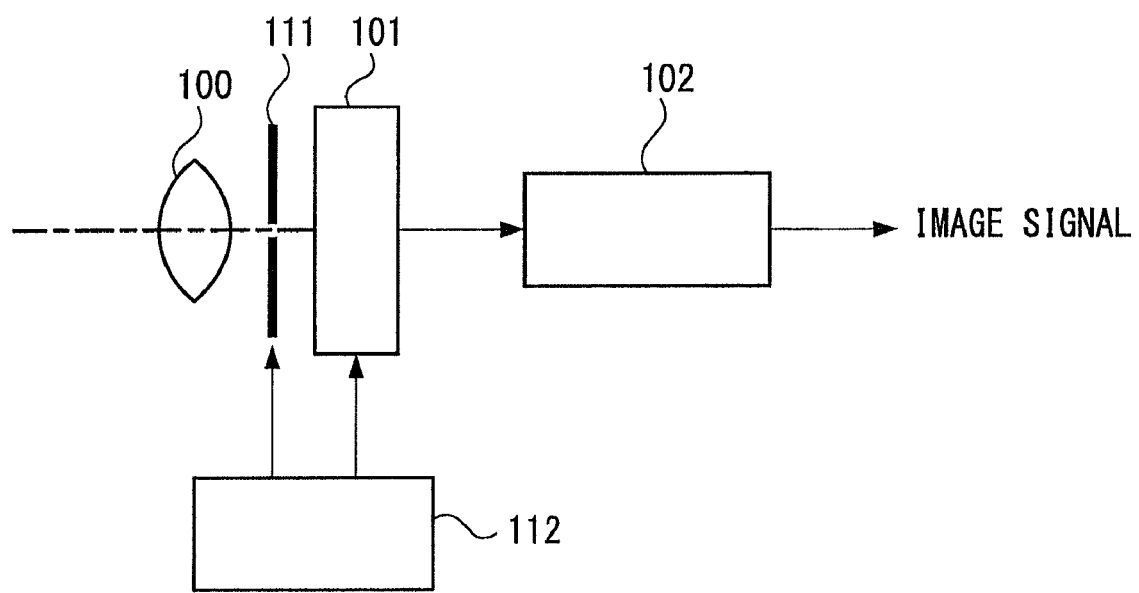
FIG. 16 is a block diagram of a camera according to an embodiment of the present invention.

FIG. 16 is a cross-sectional view of a camera according to an embodiment of the present invention which can be provided as one for any of the aforementioned examples of solid-state imaging devices according to an embodiment of the present invention. An example of the camera which can be employed for each of the examples is a video camera capable of capturing still images or moving images.

The camera of the embodiment includes a solid-state imaging device 101 typified by CCD, COMS sensor, CMD, or the like in accordance with an embodiment of the present invention, an optical system 110, a mechanical shutter device 111, and a signal-processing circuit 112, which are either formed therein or mounted thereto.

The optical system 110 focuses image light (incident light) from a subject on the imaging area of the solid-state imaging device 101 to form an image, thereby accumulating the corresponding signal charges in the solid-state imaging device 101 for a given period of time.

The mechanical shutter device 111 controls the period of light with which the solid-state imaging device 101 is illuminated and the period of light-shielding.

The signal-processing circuit 112 carries out various kinds of signal processing. Video signals subjected to the signal processing are stored in a storage medium such as a memory device or output to a monitor.

In any of the aforementioned examples according to an embodiment of the present invention, there has been described an example applied to the solid-state imaging device 101 in which unit pixels for detecting signal charges corresponding to the amounts of visible light as physical values are arranged in matrix. Alternatively, an embodiment of the present invention is not only applied to any of the aforementioned solid-state imaging devices but also applied to any of column-system solid-state imaging devices in which a column circuit is arranged every pixel row in a pixel array section.

Furthermore, an embodiment of the present invention is not only applied to the solid-state imaging device for obtaining images by detecting the distribution of amount of visible incident light but also applicable to a solid-state imaging device for obtaining images as the distribution of amount of incident infrared rays, X-rays, particles, or the like. In the broad sense of the term, furthermore, it is further applicable to all kinds of solid-state imaging devices including a fingerprint-detecting sensor for obtaining images by detecting the distribution of another physical value, such as pressure or electric capacity (physical-value distribution detector).

Furthermore, an embodiment of the present invention is not limited to the solid-state imaging device that scans each unit pixel in every line of the pixel array section in order and then reads out pixel signals from the respective unit pixels. An embodiment of the present invention is also applicable to an X-Y address-type solid-state imaging device. This device selects any pixel as a unit and reads out signals per pixel from the selected pixel.

Furthermore, the solid-state imaging device may be formed in on-chip configuration. Alternatively, it may be formed in module configuration with an imaging function in which an imaging part, a signal-processing part, and an optical system are packaged in one.

Furthermore, an embodiment of the present invention is not limited to the solid-state imaging device but also applicable to any of imaging apparatuses. Here, the term "imaging apparatuses" mean camera systems, for example, a digital still camera and a video camera, and electronic apparatuses with image-pickup functions, such as a mobile phone. Furthermore, the imaging apparatus may be employed as the aforementioned configuration of the module mounted to the electronic apparatus, that is, the camera module.

The imaging apparatuses, for example, video cameras and digital still cameras as well as camera modules for mobile apparatuses including mobile phones, can obtain images of high qualities with simplified configurations thereof using the solid-state imaging device 101 according to any of the aforementioned examples as its solid-state imaging device.

Any of the aforementioned embodiments of the present invention has been described as one applied to the CMOS solid-state imaging device (CMOS image sensor). Alternatively, an embodiment of the present invention is applicable to another solid-state imaging device with a different configuration. Likewise, for example, an embodiment of the present invention is applicable to a CCD solid-state imaging device (CCD image sensor).

In any of the aforementioned examples, the light sensing part includes the photodiode and is formed in the silicon substrate 1. According to an embodiment of the present invention, however, the light sensing part is not limited to be formed in the silicon substrate 1. Alternatively, the substrate 1 may be one made of another kind of a semiconductor material other than silicon, one on which a semiconductor epitaxial layer is formed, or the like.

The present invention is not limited to any of the aforementioned embodiments. It may be modified in various forms without departing from the gist of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
   a substrate having a light sensing part for each of a plurality of pixels;
   a plurality of individual independent rod members made of a light transmissive material directly above the light sensing part for each of the plurality of pixels.

2. The solid-state imaging device according to claim 1, wherein
   the rod members are different kinds of rod members with different sizes in a horizontal direction to allow light of different wavelength ranges to be transmitted, and
   the rod members of the same pixel are equal in size.

3. The solid-state imaging device according to claim 2, further comprising:
   a color filter for each of the pixels and provided between the rod member of each of the pixels and the substrate.

4. The solid-state imaging device according to claim 1, further comprising:
   a lens for focusing incident light, wherein
   the lens is provided between the rod member of each of the pixels and the substrate.

5. The solid-state imaging device according to claim 1, further comprising:
   an optical waveguide for leading incident light to the light sensing part, wherein
   the optical waveguide is provided between the rod member of each of the pixels and the substrate.

6. The solid-state imaging device according to claim 1, further comprising:
   an additional material different from the rod member, wherein
   a surrounding area of the rod member is embedded with the additional material.

7. The solid-state imaging device according to claim 1, wherein
   the additional material is a color filter selected for a predetermined color for each of the pixels.

8. The solid-state imaging device according to claim 1, further comprising:
   a reflective layer for reflecting light, wherein
   the reflective layer is provided in a space between the rod members.

9. The solid-state imaging device according to claim 1, further comprising:
   a layer made of a material with a refractive index which is an intermediate between a refractive index of the material of the rod member and a refractive index of a surrounding material, wherein
   the layer is provided at least on the upper end of the rod member.

10. The solid-state imaging device according to claim 1, wherein
    the rod member has a circular or rectangular cross section.

11. The solid-state imaging device according to claim 1, wherein
    the rod members of all of the pixels are equal in size 12. A method of manufacturing a solid-state imaging device, comprising:
    forming a light sensing part for each pixel in a substrate;
    forming a layer made of a light transmissive material above the substrate; and
    forming a plurality of individual independent rod members directly above the light sensing part of each pixel by processing the layer made of the light transmissive material.

13. An electronic apparatus, comprising:
    a substrate having a light sensing part for each of pixels;
    a plurality of individual independent rod members made of a light transmissive material directly above the light sensing part for each of the pixels; and
    a signal-processing circuit.

14. A method of manufacturing an electronic apparatus, comprising:
    forming a light sensing part for each pixel in a substrate;
    forming a layer made of a light transmissive material above the substrate;
    forming a plurality of individual independent rod members directly above the light sensing part of each pixel by processing the layer made of the light transmissive material; and
    providing a signal-processing circuit.

* * * * *